(12) United States Patent
Carter et al.

(10) Patent No.: US 7,677,956 B2
(45) Date of Patent: Mar. 16, 2010

(54) COMPOSITIONS AND METHODS FOR DIELECTRIC CMP

(75) Inventors: Phillip Carter, Naperville, IL (US);
Gregory H Bogush, Aurora, IL (US);
Farhana Khan, Naperville, IL (US);
Timothy P Johns, Aurora, IL (US);
Robert Vacassy, Aurora, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 434 days.

(21) Appl. No.: 10/142,681

(22) Filed: May 10, 2002

(65) Prior Publication Data

US 2003/0211815 A1 Nov. 13, 2003

(51) Int. Cl.
*B24B 1/00* (2006.01)
*B24B 7/19* (2006.01)
*B24B 7/30* (2006.01)
*B24B 7/22* (2006.01)

(52) U.S. Cl. .............................. 451/41; 451/36; 451/28
(58) Field of Classification Search .................. 451/41, 451/28, 36, 60, 63
See application file for complete search history.

(56) References Cited

U.S. PATENT DOCUMENTS

| | | | |
|---|---|---|---|
| 4,169,337 A | 10/1979 | Payne | |
| 4,462,188 A * | 7/1984 | Payne | 451/41 |
| 4,752,628 A | 6/1988 | Payne | |
| 4,867,757 A | 9/1989 | Payne | |
| 5,527,423 A | 6/1996 | Neville et al. | |
| 5,738,800 A | 4/1998 | Hosali et al. | |
| 5,759,917 A | 6/1998 | Grover et al. | |
| 5,876,490 A * | 3/1999 | Ronay | 106/3 |
| 6,042,741 A | 3/2000 | Hosali et al. | |
| 6,045,605 A * | 4/2000 | Doi et al. | 106/3 |
| 6,062,968 A | 5/2000 | Sevilla et al. | |
| 6,117,220 A | 9/2000 | Kodama et al. | |
| 6,126,532 A | 10/2000 | Sevilla et al. | |
| 6,132,637 A | 10/2000 | Hosali et al. | |
| 6,218,305 B1 | 4/2001 | Hosali et al. | |
| 6,322,600 B1 * | 11/2001 | Brewer et al. | 51/308 |
| 6,443,827 B1 * | 9/2002 | Ryoke et al. | 451/533 |
| 6,527,622 B1 * | 3/2003 | Brusic et al. | 451/28 |
| 6,527,652 B1 * | 3/2003 | Maruko et al. | 473/371 |
| 6,572,693 B1 * | 6/2003 | Wu et al. | 106/35 |
| 6,656,241 B1 * | 12/2003 | Hellring et al. | 51/308 |
| 6,682,575 B2 * | 1/2004 | Vacassy | 51/308 |
| 6,730,156 B1 * | 5/2004 | Windisch et al. | 106/35 |
| 6,743,267 B2 * | 6/2004 | Jernakoff et al. | 51/307 |
| 6,750,273 B2 * | 6/2004 | Chao | 523/212 |
| 6,761,619 B1 * | 7/2004 | Held | 451/41 |
| 6,830,811 B2 * | 12/2004 | Chao | 428/405 |
| 6,896,364 B2 * | 5/2005 | Nakazawa et al. | 347/105 |
| 6,930,037 B2 * | 8/2005 | Tsuchiya et al. | 438/631 |
| 2001/0006224 A1 * | 7/2001 | Tsuchiya et al. | 252/79 |
| 2001/0051433 A1 | 12/2001 | Francis et al. | |

FOREIGN PATENT DOCUMENTS

| | | |
|---|---|---|
| EP | 1 061 111 A1 | 12/2000 |
| EP | 1 118 647 A1 | 7/2001 |
| EP | 1 125 999 A1 | 8/2001 |
| EP | 1 160 300 A2 | 12/2001 |
| JP | 1989-87146 A | 3/1989 |
| JP | 2001-064631 A | 3/2001 |
| JP | 2001-064632 A | 3/2001 |
| JP | 2001-064679 A | 3/2001 |
| JP | 2001-064680 A | 3/2001 |
| JP | 2001-064681 A | 3/2001 |
| JP | 2001-064685 A | 3/2001 |
| JP | 2001-064688 A | 3/2001 |
| JP | 2001-064689 A | 3/2001 |
| JP | 2001-107089 A | 4/2001 |
| WO | WO 00/25984 A1 | 5/2000 |
| WO | WO 01/56070 A1 | 8/2001 |
| WO | WO 02/01620 A2 | 1/2002 |

OTHER PUBLICATIONS

Ferra et al., Technical Advances in Chemical Mechanical Planarization (CMP) (Mar. 2001).

* cited by examiner

*Primary Examiner*—Joseph J Hail, III
*Assistant Examiner*—Alvin J Grant
(74) *Attorney, Agent, or Firm*—Thomas E. Omholt; Caryn Borg-Breen; Frank J. Koszyk

(57) ABSTRACT

The invention is directed to a chemical-mechanical polishing composition comprising (a) an abrasive consisting essentially of aggregated silica, (b) an acid, and (c) a liquid carrier, wherein the polishing composition has a pH of about 5 or less. The invention is also directed to a method of polishing a substrate comprising a dielectric layer using the polishing composition.

22 Claims, No Drawings

COMPOSITIONS AND METHODS FOR DIELECTRIC CMP

FIELD OF THE INVENTION

This invention pertains to CMP compositions and methods for polishing substrates comprising dielectric layers.

BACKGROUND OF THE INVENTION

Compositions and methods for planarizing or polishing the surface of a substrate are well known in the art. Polishing compositions (also known as polishing slurries) typically contain an abrasive material in an aqueous solution and are applied to a surface by contacting the surface with a polishing pad saturated with the polishing composition. Typical abrasive materials include silicon dioxide, cerium oxide, aluminum oxide, zirconium oxide, and tin oxide. U.S. Pat. No. 5,527,423, for example, describes a method for chemically-mechanically polishing a metal layer by contacting the surface with a polishing slurry comprising high purity fine metal oxide particles in an aqueous medium. The polishing slurry is typically used in conjunction with a polishing pad (e.g., polishing cloth or disk). Suitable polishing pads are described in U.S. Pat. Nos. 6,062,968, 6,117,000, and 6,126,532 which disclose the use of sintered polyurethane polishing pads having an open-celled porous network and U.S. Pat. No. 5,489,233 which discloses the use of solid polishing pads having a surface texture or pattern. Alternatively, the abrasive material may be incorporated into the polishing pad. U.S. Pat. No. 5,958,794 discloses a fixed abrasive polishing pad.

Conventional polishing systems and polishing methods typically are not entirely satisfactory at planarizing semiconductor wafers. In particular, polishing compositions and polishing pads can have less than desirable polishing rates or polishing selectivities, and their use in chemically-mechanically polishing semiconductor surfaces can result in poor surface quality. Because the performance of a semiconductor wafer is directly associated with the planarity of its surface, it is crucial to use a polishing composition and method that results in a high polishing efficiency, selectivity, uniformity, and removal rate and leaves a high quality polish with minimal surface defects.

The difficulty in creating an effective polishing system for semiconductor wafers stems from the complexity of the semiconductor wafer. Semiconductor wafers are typically composed of a substrate, on which a plurality of transistors has been formed. Integrated circuits are chemically and physically connected into a substrate by patterning regions in the substrate and layers on the substrate. To produce an operable semiconductor wafer and to maximize the yield, performance, and reliability of the wafer, it is desirable to polish select surfaces of the wafer without adversely affecting underlying structures or topography. In fact, various problems in semiconductor fabrication can occur if the process steps are not performed on wafer surfaces that are adequately planarized.

Typically, polishing compositions for polishing dielectric materials require an alkaline pH in order to obtain sufficient removal rates for the dielectric. For example, U.S. Pat. Nos. 4,169,337, 4,462,188, and 4,867,757 disclose polishing compositions for silicon dioxide removal comprising silica abrasives at an alkaline pH. Similarly, WO 00/25984, WO 01/56070, and WO 02/01620 disclose polishing compositions for STI polishing comprising fumed silica at alkaline pH. U.S. Patent Application 2001/0051433 A1 discloses a polishing composition for dielectric CMP comprising fumed silica and a cesium salt with a pH of 7 or greater.

Such alkaline polishing compositions, while effective in the removal of silicon dioxide dielectric materials, provide poor selectivity in substrates comprising both silicon dioxide and silicon nitride layers, as in Shallow Trench Isolation (STI) substrates. The use of acid additives to improve the selectivity in STI polishing is known in the art. U.S. Pat. Nos. 5,738,800, 6,042,741, 6,132,637, and 6,218,305 disclose the use of acid-containing complexing agents in polishing compositions comprising an abrasive (e.g., ceria or silica) at a pH of preferably about 6 to about 7. The acid species of the complexing agents can be carboxylic acids, sulfonic acids, or phosphonic acids. U.S. Pat. No. 5,614,444 discloses the use of additives comprising anionic, cationic, or nonionic polar groups to suppress the removal of a dielectric material (e.g., silicon dioxide or silicon nitride). EP 1 061 111 A1 discloses polishing compositions for STI polishing comprising ceria abrasive and an organic compound comprising a carboxylic acid or sulfonic acid group, preferably at a pH>4. The use of sulfonic acid additives as dispersants or flocculating agents for abrasives is also commonly known in the art. For example, JP 01087146 discloses a polishing composition comprising water, polystyrenesulfonic acid (or salt thereof) dispersing agent, and a polishing agent (e.g., aluminum oxide (i.e., alumina), silicon dioxide, cerium oxide, zirconium oxide, titanium oxide, or silicon nitride). U.S. Pat. No. 6,117,220 discloses a polishing composition for use in polishing a memory hard disk comprising water, polystyrenesulfonic acid, an inorganic acid or organic acid, and an abrasive selected from the group consisting of alumina, silica, ceria, zirconia, titania, silicon nitride, and magnesia. JP 2001064631 discloses a polishing composition comprising an abrasive and a polymer or copolymer comprising sulfonic acid groups, with a pH of 1-13.

A need remains, however, for polishing systems and polishing methods that will exhibit desirable planarization efficiency, selectivity, uniformity, and removal rate during the polishing and planarization of dielectric substrates, while minimizing defectivity, such as surface imperfections and damage to underlying structures and topography during polishing and planarization.

The invention seeks to provide such a chemical-mechanical polishing system and method. These and other advantages of the invention will be apparent from the description of the invention provided herein.

BRIEF SUMMARY OF THE INVENTION

The invention provides a chemical-mechanical polishing composition comprising (a) an abrasive consisting essentially of aggregated silica, (b) an acid, and (c) a liquid carrier, wherein the polishing composition has a pH of about 5 or less. The invention is also directed to a method of polishing a substrate using the polishing composition, wherein the substrate has a surface area, and the dielectric layer comprises (i.e., makes up) about 95% or more of the total surface area of the substrate.

DETAILED DESCRIPTION OF THE INVENTION

The invention is directed to a chemical-mechanical polishing composition comprising an abrasive consisting essentially of aggregated silica, an acid, and a liquid carrier. The polishing composition has a pH of about 5 or less.

Aggregated silica is defined as any silica abrasive comprising silica particles in a state of connectivity with other silica particles, wherein the connectivity results from the formation of covalent bonds, or non-covalent (e.g., electrostatic) interactions, between the silica particles. Silica aggregates typically have a void space caused by imperfect packing of the silica particles upon aggregation. The aggregated silica abrasive is typically fumed (i.e., pyrogenic) silica but can be any form of aggregated silica, including precipitated silica. The aggregated silica can have any suitable average surface area and particle size. The aggregated silica desirably has an average surface area of about 100 $m^2$/g or less (e.g., about 70 $m^2$/g or less). The aggregated silica desirably also has an average surface area of about 20 $m^2$/g or more (e.g., about 30 $m^2$/g or more). Preferably, the aggregated silica has an average surface area of about 40 $m^2$/g to about 60 $m^2$/g (e.g., about 50 $m^2$/g). The aggregated silica typically has a mean particle size of about 100 nm to about 1000 nm (e.g., about 100 nm to about 500 nm). Preferably, the aggregated silica has a mean particle size of about 100 nm to about 250 nm, more preferably about 225 nm. The aggregated silica typically has a particle size distribution of about ±100 nm.

The large particle fraction of the particle size distribution should be minimized such that the total number of particles having a diameter of about 1.5 microns or greater, as detected by a single particle optical sensing device, is about 1000 particles or less (preferably about 500 particles or less, more preferably about 200 particles or less) per ml of polishing composition for a polishing composition having 0.01 wt. % abrasive particles. Preferably, the total number of particles having a diameter of about 1 micron or greater, as detected by a single particle optical sensing device, is about 2000 particles or less (preferably about 1000 particles or less, more preferably about 400 particles or less) per ml of polishing composition for a polishing composition having 0.01 wt. % abrasive particles.

Any suitable amount of aggregated silica can be present in the chemical-mechanical polishing composition. The polishing composition typically comprises about 0.5 wt. % to about 20 wt. % aggregated silica. Preferably, the polishing composition comprises about 2 wt. % to about 15 wt. % (e.g., about 5 wt. % to about 10 wt. %) aggregated silica.

The acid can be any suitable acid, which can be present in the polishing composition in any suitable amount. The acid can be an inorganic acid or an organic acid. Suitable inorganic acids include, but are not limited to, nitric acid, hydrochloric acid, sulfuric acid, phosphoric acid, and combinations thereof. Suitable organic acids include, but are not limited to, gluconic acid, lactic acid, citric acid, tartaric acid, malic acid, malonic acid, formic acid, oxalic acid, succinic acid, fumaric acid, maleic acid, phthalic acid, and combinations thereof.

The acid also can be an anionic polymer or copolymer (e.g., a homopolymer, random copolymer, alternating copolymer, periodic copolymer, block copolymer, graft copolymer, or comb copolymer). The anionic polymer or copolymer typically comprises repeating units containing carboxylic acid, sulfonic acid, or phosphonic acid functional groups, or combinations thereof. Preferably, the anionic polymer or copolymer comprises repeating units selected from styrenesulfonic acid, 2-acrylamido-2-methylpropane sulfonic acid (AMPS), salts thereof, and combinations thereof. The anionic polymer or copolymer can contain only the repeating units recited above, or can be a copolymer containing one or more of those repeating units in combination with other (preferably nonionic) repeating units, for example, ethylene oxide, propylene oxide, styrene, and mixtures thereof. The number of nonionic repeating units present in the anionic copolymer desirably does not exceed 99% (e.g., 95%) of the total number of repeating units. Preferably, the number of nonionic repeating units present in the anionic copolymer does not exceed 90% (e.g., 85%). The anionic copolymer can also contain the repeating units recited above in combination with other repeating units comprising functional groups including, for example, amines or amides. The polishing composition can have any suitable amount of anionic polymer or copolymer. Typically, the polishing composition will comprise about 0.01 wt. % or more anionic polymer or copolymer (e.g., about 0.1 wt. % or more). The polishing composition also typically will comprise about 5 wt. % or less anionic polymer or copolymer (e.g., about 2 wt. % or less).

A liquid carrier is used to facilitate the application of the abrasive, acid, and any optional additives to the surface of a suitable substrate to be polished (e.g., planarized). The liquid carrier is typically an aqueous carrier and can be water alone, can comprise water and a suitable water-miscible solvent, or can be an emulsion. Suitable water-miscible solvents include alcohols such as methanol, ethanol, etc. Preferably, the aqueous carrier consists of water, more preferably deionized water.

The polishing composition has an acidic pH of about 7 or less. Typically, the pH is about 5 or less (e.g., about 3 or less). Preferably, the polishing composition has a pH of about 1 to about 4 (e.g., about 1.5 to about 3). Most preferably, the polishing composition has a pH of about 2.5. The polishing composition optionally further comprises pH adjusting agents, for example, potassium hydroxide or ammonium hydroxide.

The polishing composition optionally further comprises an alcohol. Preferably, the alcohol is methanol, ethanol, or propanol. More preferably, the alcohol is methanol. Typically, the alcohol is present in the polishing composition in an amount of about 0.01 wt. % or more. The alcohol also typically is present in the polishing composition in an amount of about 2 wt. % or less.

The polishing composition described herein can be used to polish (e.g., planarize) a substrate. The method of polishing a substrate comprises (i) providing the polishing composition, (ii) contacting the substrate with the polishing composition, and (iii) abrading at least a portion of the substrate to polish the substrate. The polishing composition desirably is used in a method of polishing a substrate comprising at least one dielectric layer, whereby the substrate is contacted with the polishing composition and at least a portion of the dielectric layer of the substrate is abraded such that the dielectric layer becomes polished. Preferably, the dielectric layer comprises (i.e., makes up) about 95% or more (e.g., about 97% or more, or even about 99% or more) of the total surface area of the substrate. The substrate can be any suitable substrate (e.g., an integrated circuit, memory or rigid disks, metals, ILD layers, semiconductors, micro-electro-mechanical systems, ferroelectrics, magnetic heads, polymeric films, and low and high dielectric constant films) and can contain any suitable dielectric layer (e.g., insulating layer). The dielectric layer can be any suitable dielectric material having a dielectric constant of about 4 or less. Typically the dielectric layer is a silicon-containing material, for example, silicon dioxide or oxidized silicon dioxides like carbon-doped silicon dioxide and aluminosilicates. The dielectric layer also can be a porous metal oxide, glass, organic polymer, fluorinated organic polymer, or any other suitable high or low-κ dielectric layer. The dielectric layer preferably comprises silicon oxide, silicon nitride, silicon oxynitride, silicon carbide, aluminum oxide, or a material with a dielectric constant of about 3.5 or less. When the dielectric layer is silicon dioxide, the polishing composition comprising aggregated silica, particularly fumed silica, typically has a blanket silicon dioxide removal rate of about 100 Å/min or greater (e.g., about 150 Å/min or greater).

The substrate typically further comprises one or more layers comprising a polishing stop material (e.g., silicon nitride) or a metal. When the substrate comprises silicon dioxide and silicon nitride, the use of anionic polymers or copolymers as described above is particularly effective in improving the selectivity of silicon dioxide removal relative to silicon nitride removal. The polishing composition comprising aggregated silica in combination with such anionic polymers or copolymers desirably has a silicon dioxide to silicon nitride polishing selectivity of about 10 or greater (e.g., about 50 or greater). Preferably, the silicon dioxide to silicon nitride selectivity is about 80 or greater. The selectivity can be further enhanced by the addition of an alcohol, in particular, methanol, ethanol, or propanol.

The following examples further illustrate the invention but, of course, should not be construed as in any way limiting its scope.

Example 1

This example illustrates the effectiveness of polishing compositions comprising aggregated silica at acidic pH for silicon dioxide removal.

Similar test pattern oxide wafers were polished under similar conditions using Polishing Compositions 1A-1J. Each polishing composition contained 7.5 wt. % fumed silica. Polishing Compositions 1A-1E contained fumed silica with a surface area of 50 $m^2/g$ and a mean particle diameter of 225 nm at a pH of 2.5, 4.5, 6.5, 8.5, and 10.5, respectively. Polishing Compositions 1F-1J contained fumed silica with a surface area of 90 $m^2/g$ and a mean particle diameter of 175 nm at a pH of 2.5, 4.5, 6.5, 8.5, and 10.5, respectively. The test wafers were polished with each of the polishing compositions using an IPEC 472 polishing tool. The amount of silicon dioxide removed (in Å) from a region of 10% oxide line density (10% Field Oxide Loss) was measured for each of the polishing compositions. The oxide removal rate (in Å/min) for a 70% density line pattern (70 micron line with 30 micron space) was also measured during polishing for each of the polishing compositions. The oxide loss, oxide removal rates (RR), and ratios of removal rates for the lower surface area abrasive relative to the higher surface area abrasive are summarized in Table 1.

TABLE 1

| Polishing Composition | pH | 10% Field Oxide Loss (Å) | RR (Å/min) 70% Pattern |
|---|---|---|---|
| 1A | 2.5 | 1900 | 3503 |
| 1F (invention) | | 1200 | 2307 |
| Ratio 1A/1F | | | 1.52 |
| 1B | 4.5 | 1000 | 2175 |
| 1G (invention) | | 1000 | 1397 |
| Ratio 1B/1G | | | 1.56 |

TABLE 1-continued

| Polishing Composition | pH | 10% Field Oxide Loss (Å) | RR (Å/min) 70% Pattern |
|---|---|---|---|
| 1C | 6.5 | 1100 | 1481 |
| 1H (comparative) | | 1000 | 939 |
| Ratio 1C/1H | | | 1.58 |
| 1D | 8.5 | 2200 | 1290 |
| 1I (comparative) | | 3600 | 970 |
| Ratio 1D/1I | | | 1.33 |
| 1E | 10.5 | 2800 | 2262 |
| 1J | | 3400 | 2916 |
| Ratio 1E/1J | | | 0.80 |

The results summarized in Table 1 show that an acidic pH range (e.g., a pH of about 6.5 or less) is desirable to reduce the amount of field oxide loss to an acceptable level of 2000 Å or less when using polishing compositions containing fumed silica of either 50 $m^2/g$ or 90 $m^2/g$ surface area (Polishing Compositions 1A and 1C and 1F-1H). Within this acceptable range for reduced field oxide loss, the results show that the optimal pattern oxide removal rates occur when the pH is strongly acidic, e.g., at pH=2.5, and in particular for fumed silica with 50 $m^2/g$ surface area (Polishing Composition 1A).

This example demonstrates that optimal oxide polishing behavior is observed for polishing compositions containing aggregated silica abrasive at acidic pH.

Example 2

This example illustrates that the blanket removal rate for silicon dioxide substrates under acidic conditions is substantially improved using aggregated silica abrasive having 50 $m^2/g$ surface area.

Similar test pattern oxide wafers were polished under similar conditions using Polishing Compositions 2A-2D. Each polishing composition contained 7.5 wt. % fumed silica at a pH of 2.5. Polishing Composition 2A (invention) contained fumed silica with a surface area of 50 $m^2/g$ and a mean particle diameter of 225 nm. Polishing Composition 2B (invention) contained fumed silica with a surface area of 90 $m^2/g$ and a mean particle diameter of 175 nm. Polishing Composition 2C (invention) contained fumed silica with a surface area of 160 $m^2/g$ and a mean particle diameter of 135 nm. Polishing Composition 2D (invention) contained fumed silica with a surface area of 380 $m^2/g$ and a mean particle diameter of 125 nm. The test wafers were polished with each of the polishing compositions using an IPEC 472 polishing tool.

The removal rates for blanket oxide wafers (in Å/min) as well as the step height remaining for an 8000 Å step pattern having 70% line density (100 micron pitch) after 180 seconds of polish time were measured for each of the polishing compositions. The planarization efficiency, defined as the ratio of the 70% dense step height reduction (7500 Å) divided by the 10% dense field oxide loss required to achieve that reduction, was also determined. The results are summarized in Table 2.

TABLE 2

| Polishing Composition | Surface Area ($m^2/g$) | Mean particle size (nm) | Blanket Removal Rate (Å/min) | Remaining Step Height (Å) | Planarization Efficiency |
|---|---|---|---|---|---|
| 2A (invention) | 50 | 225 | 150 | 162 | >3.1 |

TABLE 2-continued

| Polishing Composition | Surface Area ($m^2/g$) | Mean particle size (nm) | Blanket Removal Rate (Å/min) | Remaining Step Height (Å) | Planarization Efficiency |
|---|---|---|---|---|---|
| 2B (invention) | 90 | 175 | 0 | 798 | 5.0 |
| 2C (invention) | 160 | 135 | 0 | 1089 | 4.7 |
| 2D (invention) | 380 | 125 | 0 | 1700 | 4.4 |

The results shown in Table 2 demonstrate that under acidic conditions (e.g., at a pH of 2.5), the removal rates for dielectric materials are superior using aggregated silica having a surface area of 50 $m^2/g$ (Polishing Composition 2A).

Example 3

This example illustrates that high selectivity for oxide removal relative to nitride removal can be achieved through the incorporation of anionic polymer or copolymer additives.

Similar substrates containing silicon dioxide and silicon nitride layers were polished under similar conditions using Polishing Compositions 3A-3D. Each of the polishing compositions contained fumed silica at a pH of 2.5. Polishing Composition 3A (invention) contained fumed silica with a surface area of 50 $m^2/g$ and no anionic polymer additive. Polishing Compositions 3B-3D (invention) contained fumed silica with a surface area of 50 $m^2/g$ and 0.1 wt. %, 0.5 wt. %, and 2 wt. % polystyrenesulfonic acid, respectively. The removal rates for the oxide and nitride layers were measured for each of the polishing compositions. The removal rates (RR) and silicon dioxide to silicon nitride selectivity are summarized in Table 3.

TABLE 3

| Polishing Composition | Polymer Additive | Oxide RR (Å/min) | Nitride RR (Å/min) | Oxide/Nitride Selectivity |
|---|---|---|---|---|
| 3A (invention) | none | 315 | 510 | 0.6 |
| 3B (invention) | 0.1 wt. % | 331 | 3.8 | 87 |
| 3C (invention) | 0.5 wt. % | 487 | 4.1 | 120 |
| 3D (invention) | 2 wt. % | 333 | 4.2 | 80 |

The results shown in Table 3 demonstrate that silicon dioxide to silicon nitride selectivity is improved upon addition of an acid that is an anionic polymer or copolymer to the polishing composition of the invention.

Example 4

This example illustrates that the polishing composition of the invention exhibits a reduced silicon nitride removal rate upon addition of an alcohol.

Similar substrates comprising silicon dioxide and silicon nitride layers were polished under similar conditions with different polishing compositions (Polishing Composition 4A-D). Polishing Composition 4A (invention) contained 10 wt. % fumed silica and 0.4 wt. % polystyrenesulfonate at a pH of 2.5. The fumed silica had an average surface area of 50 $m^2/g$. Polishing Composition 4B (invention) was the same as Polishing Composition 4A except that it further comprised 0.1 wt. % methanol. Polishing Composition 4C (invention) contained 10 wt. % fumed silica and 0.4 wt. % polystyrenesulfonate at a pH of 2.5. The fumed silica had an average surface area of 50 $m^2/g$. Polishing Composition 4D (invention) was the same as Polishing Composition 4C except that it further comprised 0.1 wt. % isopropanol. The silicon dioxide and silicon nitride removal rates (RR) (in Å/min), as well as the oxide/nitride removal rate ratios (i.e., selectivities), were determined using each of the polishing compositions for regions of 30% pattern density. The results are summarized in Table 4.

TABLE 4

| Polishing Composition | Alcohol Additive | Oxide RR (Å/min) | Nitride RR (Å/min) | Oxide/Nitride Selectivity |
|---|---|---|---|---|
| 4A (invention) | None | 5900 | 580 | 10 |
| 4B (invention) | MeOH | 5700 | 330 | 17 |
| 4C (invention) | None | 4597 | 112 | 41 |
| 4D (invention) | $^i$PrOH | 4503 | 30 | 150 |

The results shown in Table 4 demonstrate that although the removal rates for silicon dioxide and silicon nitride were suppressed upon addition of an alcohol, the selectivity of oxide to nitride removal was significantly improved.

Example 5

This example illustrates that polishing compositions containing anionic polymers with sulfonic acid functional groups are effective at reducing dishing.

Similar oxide pattern wafers were polished under similar conditions using different polishing compositions (Polishing Composition 5A-5F). Polishing Composition 5A (invention) contained 10 wt. % fumed silica abrasive, 0.4 wt. % polystyrenesulfonic acid (PSSA), and 0.1 wt. % propanol. Polishing Compositions 5B (invention) and 5C (invention) each contained 10 wt. % fumed silica abrasive and 0.1 wt. % or 0.4 wt. % poly(2-acrylamido-2-methylpropane sulfonic acid) (PAMPS), respectively. Polishing Composition 5D (invention) contained 10 wt. % fumed silica, 0.4 wt. % PAMPS, and 0.1 wt. % PSSA. Polishing Composition 5E (invention) contained 10 wt. % fumed silica, 0.4 wt. % PAMPS, and 0.1 wt. % propanol. The amount of silicon dioxide layer remaining after 240-290 seconds of polishing (in Å) and the trench thickness remaining (in Å) after 240-290 seconds of polishing were measured for each of the polishing compositions at various regions of pattern density. The polishing results targeted clearing of the 50% dense feature (2000 Å nitride thickness). The results are summarized in Table 5.

TABLE 5

| Polishing Composition | Additives | Silicon Dioxide Layer Remaining (Å) | | | Trench Thickness Remaining (Å) | | |
|---|---|---|---|---|---|---|---|
| | | 30% density | 50% density | 70% density | 30% density | 50% density | 70% density |
| 5A (invention) | 0.4 wt. % PSSA + 0.1 wt. % propanol | 1893 | 1958 | 2641 | 4700 | 5235 | 5832 |
| 5B (invention) | 0.1 wt. % PAMPS | 1912 | 2020 | 2683 | 5753 | 5916 | 6194 |
| 5C (invention) | 0.4 wt. % PAMPS | 1909 | 2067 | 2712 | 5841 | 5973 | 6219 |
| 5D (invention) | 0.4 wt. % PAMPS + 0.1 wt. % PSSA | 1903 | 2041 | 2791 | 5614 | 5842 | 6186 |
| 5E (invention) | 0.4 wt. % PAMPS + 0.1 wt. % propanol | 1912 | 2179 | 2815 | 5962 | 6061 | 6317 |

The results shown in Table 5 demonstrate that polishing compositions containing poly(2-acrylamido-2-methylpropane sulfonic acid) (Polishing Compositions 5B-5E) have similar oxide removal rates to those obtained using polishing compositions containing polystyrenesulfonic acid (Polishing Composition 5A); however, polishing compositions containing poly(2-acrylamido-2-methylpropane sulfonic acid) have reduced dishing compared to polishing compositions containing polystyrenesulfonic acid (as evidenced by the additional trench thickness remaining at the various regions of tested pattern densities).

Example 6

This example illustrates the pH dependence of the oxide removal relative to nitride removal (e.g., the selectivity) characteristics of a polishing composition.

Similar substrates containing silicon dioxide and silicon nitride layers were polished under similar conditions using Polishing Compositions 6A-6C. Each of the polishing compositions contained 10 wt. % fumed silica and 0.2 wt. % poly(2-acrylamido-2-methylpropane sulfonic acid). Polishing Compositions 6A (invention), 6B (invention), and 6C (comparative) had a pH of 2.5, 4.0, and 5.5. respectively. The removal rates for the oxide and nitride layers were measured for each of the polishing compositions. The removal rates (RR) and silicon dioxide to silicon nitride selectivity are summarized in Table 6.

TABLE 6

| Polishing Composition | pH | Oxide RR (Å/min) | Nitride RR (Å/min) | Oxide/Nitride Selectivity |
|---|---|---|---|---|
| 6A (invention) | 2.5 | 358 | 12 | 30 |
| 6B (invention) | 4.0 | 122 | 12 | 10 |
| 6C (comparative) | 5.5 | 78 | 200 | 0.4 |

The results shown in Table 6 demonstrate that silicon dioxide to silicon nitride selectivity is significantly enhanced when the pH is about 5 or less.

Example 7

This example compares a polishing composition of the invention to a polishing composition comprising non-aggregated precipitated silica.

Similar substrates comprising silicon dioxide and silicon nitride layers were polished under similar conditions with different polishing compositions (Polishing Composition 7A and 7B). Polishing Composition 7A (invention) contained 10 wt. % fumed silica and 0.4 wt. % polystyrenesulfonic acid at a pH of 2.5. The fumed silica had an average surface area of 50 $m^2/g$. Polishing Composition 7B (comparative) was the same as Polishing Composition 7A except that it comprised 10 wt. % non-aggregated precipitated silica having an average particle size of about 100 nm or more. The amount removal rates (RR) (in Å/min) for the silicon dioxide and silicon nitride layers, as well as the oxide/nitride removal rate ratios (i.e., selectivities), were determined using each of the polishing compositions. The results are summarized in Table 7.

TABLE 7

| Polishing Composition | Oxide RR (Å/min) | Nitride RR (Å/min) | Oxide/Nitride Selectivity |
|---|---|---|---|
| 7A (invention) | 1855 | 12 | 155 |
| 7B (comparative) | 1245 | 332 | 3.7 |

The results shown in Table 7 demonstrate that aggregated silica exhibits superior oxide to nitride selectivity compared to non-aggregated silica.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A method of polishing a substrate comprising:
   (i) contacting a substrate having a surface area comprising a dielectric layer with a chemical-mechanical polishing composition comprising:
      (a) an abrasive consisting essentially of aggregated silica,
      (b) an acid, wherein the acid is an anionic polymer or copolymer, and wherein the anionic polymer or copolymer comprises repeating units selected from the group consisting of styrenesulfonic acid, 2-acrylamido-2-methylpropane sulfonic acid, salts thereof, and combinations thereof, and
      (c) a liquid carrier,
   wherein the dielectric layer comprises about 95% or more of the total surface area of the substrate, and wherein the polishing composition has a pH of about 3 or less, and
   (ii) abrading at least a portion of the substrate to polish the dielectric layer.

2. The method of claim 1, wherein the aggregated silica is fumed silica.

3. The method of claim 1, wherein the liquid carrier comprises water.

4. The method of claim 1, wherein the aggregated silica has an average surface area of about 30 $m^2/g$ to about 70 $m^2/g$.

5. The method of claim 4, wherein the aggregated silica has an average surface area of about 40 $m^2/g$ to about 60 $m^2/g$.

6. The method of claim 5, wherein the aggregated silica has an average surface area of about 50 $m^2/g$.

7. The method of claim 1, wherein the aggregated silica has a mean particle size of about 100 nm to about 250 nm.

8. The method of claim 1, wherein the polishing composition comprises about 0.5 wt. % to about 20 wt. % aggregated silica.

9. The method of claim 1, wherein the dielectric layer comprises a silicon-containing material having a dielectric constant of about 4 or less.

10. The method of claim 9, wherein the dielectric layer comprises silicon dioxide.

11. The method of claim 10, wherein the aggregated silica has a blanket silicon dioxide removal rate of about 100 Å/min or greater.

12. The method of claim 9, wherein the substrate further comprises a silicon nitride layer.

13. The method of claim 1, wherein the silicon dioxide to silicon nitride polishing selectivity is about 50 or greater.

14. The method of claim 1, wherein the polishing composition comprises about 0.1 wt. % to about 2 wt. % anionic polymer or copolymer.

15. The method of claim 1, wherein the polishing composition further comprises an alcohol.

16. A chemical-mechanical polishing composition comprising:
   (a) an abrasive consisting essentially of aggregated silica having a surface area of about 30 $m^2/g$ to about 70 $m^2/g$ and a particle size of about 100 nm to about 250 nm,
   (b) an acid, wherein the acid is an anionic polymer or copolymer, and wherein the anionic polymer or copolymer comprises repeating units selected from the group consisting of styrenesulfonic acid, 2-acrylamido-2-methylpropane sulfonic acid, salts thereof, and combinations thereof, and
   (c) a liquid carrier,
wherein the polishing composition has a pH of about 3 or less.

17. The polishing composition of claim 16, wherein the liquid carrier comprises water.

18. The polishing composition of claim 16, wherein the aggregated silica has an average surface area of about 40 $m^2/g$ to about 60 $m^2/g$.

19. The polishing composition of claim 18, wherein the aggregated silica has an average surface area of about 50 $m^2/g$.

20. The polishing composition of claim 16, wherein the aggregated silica is fumed silica.

21. The polishing composition of claim 16, wherein the composition further comprises an alcohol.

22. The polishing composition of claim 21, wherein the alcohol is methanol, ethanol, or propanol.

* * * * *